(12) United States Patent
Miyake

(10) Patent No.: US 9,245,935 B2
(45) Date of Patent: Jan. 26, 2016

(54) LIGHT-EMITTING DEVICE

(71) Applicant: Semiconductor Energy Laboratory Co., Ltd., Atsugi-shi, Kanagawa-ken (JP)

(72) Inventor: Hiroyuki Miyake, Atsugi (JP)

(73) Assignee: SEMICONDUCTOR ENERGY LABORATORY CO., LTD., Atsugi-Shi (JP)

( * ) Notice: Subject to any disclaimer, the term of this patent is extended or adjusted under 35 U.S.C. 154(b) by 125 days.

(21) Appl. No.: 14/208,689

(22) Filed: Mar. 13, 2014

(65) Prior Publication Data

US 2014/0291640 A1    Oct. 2, 2014

(30) Foreign Application Priority Data

Apr. 2, 2013 (JP) .................. 2013-076651

(51) Int. Cl.
*H01L 35/24* (2006.01)
*H01L 27/32* (2006.01)
*G09G 3/32* (2006.01)

(52) U.S. Cl.
CPC .......... *H01L 27/3262* (2013.01); *G09G 3/3233* (2013.01); *G09G 2300/0819* (2013.01); *G09G 2300/0842* (2013.01); *G09G 2310/0262* (2013.01); *G09G 2320/0233* (2013.01); *G09G 2320/0295* (2013.01)

(58) Field of Classification Search
None
See application file for complete search history.

(56) References Cited

U.S. PATENT DOCUMENTS

| | | | |
|---|---|---|---|
| 6,528,951 B2 | 3/2003 | Yamazaki et al. | |
| 7,399,991 B2 | 7/2008 | Seo et al. | |
| 8,154,541 B2 | 4/2012 | Koyama et al. | |
| 2006/0208979 A1 | 9/2006 | Fish et al. | |
| 2008/0030446 A1 | 2/2008 | Asano | |
| 2011/0242143 A1 | 10/2011 | Yamashita et al. | |
| 2014/0291640 A1* | 10/2014 | Miyake | H01L 27/3262 257/40 |
| 2015/0054722 A1* | 2/2015 | Kanda | G09G 3/3233 345/77 |

FOREIGN PATENT DOCUMENTS

JP   2002-324673   11/2002

* cited by examiner

*Primary Examiner* — Jack Chen
(74) *Attorney, Agent, or Firm* — Robinson Intellectual Property Law Office; Eric J. Robinson

(57) ABSTRACT

A light-emitting device in which electrical characteristics of a transistor in a pixel can be monitored without degrading display quality is provided. The light-emitting device includes a plurality of pixels each comprising a pixel circuit. A pixel circuit included in a first pixel is electrically connected to a light-emitting element included in a second pixel through a first switch. A pixel circuit included in the second pixel is electrically connected to the light-emitting element included in the second pixel through a second switch and to a light-emitting element included in a third pixel through a third switch. The pixel circuits are connected to a correction circuit through switches.

21 Claims, 13 Drawing Sheets

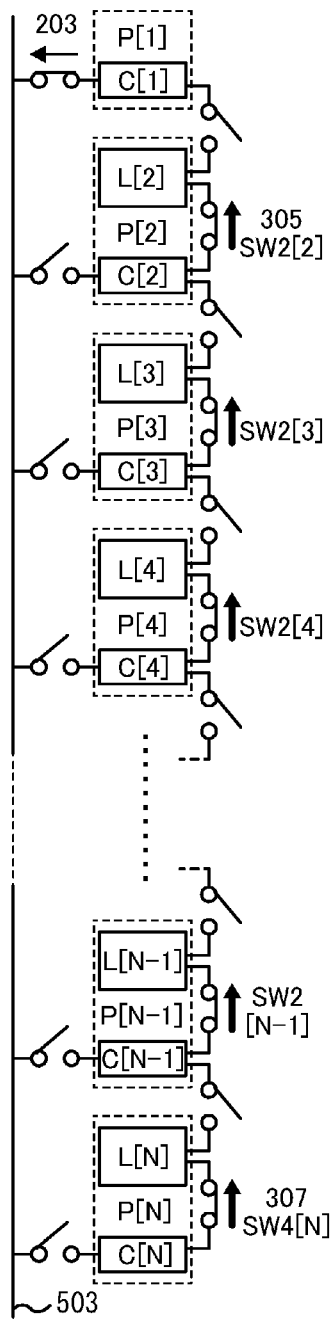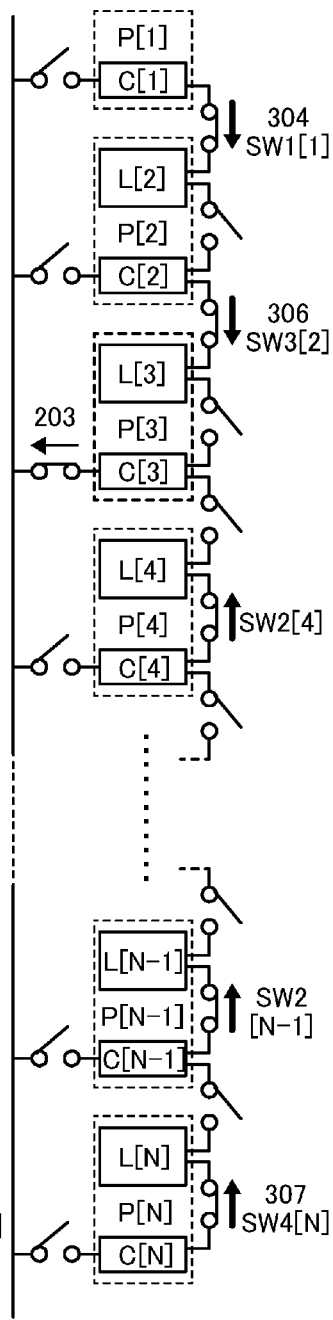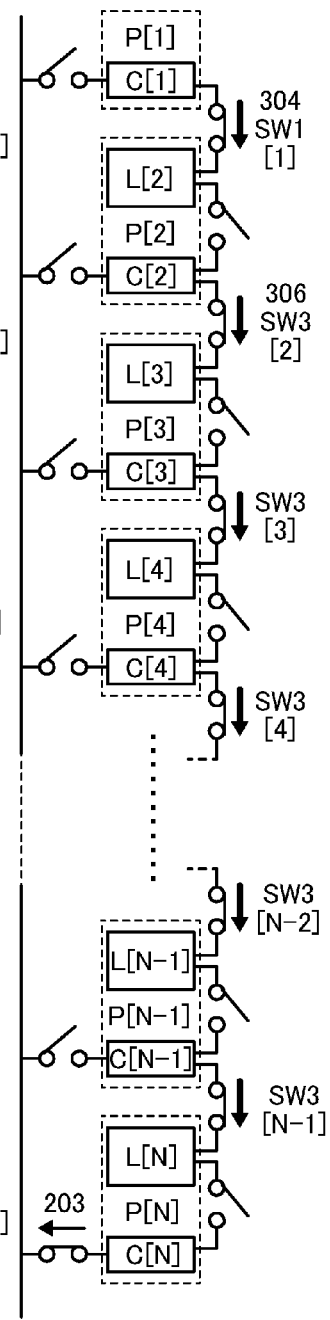

LIGHT-EMITTING DEVICE

BACKGROUND OF THE INVENTION

1. Field of the Invention

The present invention relates to a light-emitting device.

2. Description of the Related Art

In recent years, self-luminous display devices, light-emitting devices, and the like including light-emitting elements that utilize electroluminescence (EL) have attracted attention. As examples of such light-emitting elements used in such self-luminous display devices, an organic EL element and an inorganic EL element are known. These light-emitting elements emit light by themselves; thus the visibility of an image on a display device including the organic EL element or the inorganic EL element is higher than that of an image on a display device including a liquid crystal element. Further, the organic EL element and the inorganic EL element have advantages such as high response speed and unnecessity of a backlight.

An organic EL element has a structure in which a layer containing a light-emitting organic compound (also referred to as an EL layer) is sandwiched between a pair of electrodes. On application of a voltage to the pair of electrodes, light is emitted from the EL layer. A display device using such an organic EL element is disclosed in Patent Document 1.

REFERENCE

Patent Document

[Patent Document 1] Japanese Published Patent Application No. 2002-324673

SUMMARY OF THE INVENTION

In an active matrix light-emitting device including organic EL elements, the amount of current flowing through the organic EL elements is adjusted with transistors in respective pixels, and thus a gray-scale image can be displayed entirely.

If electrical characteristics vary among transistors of pixels in a light-emitting device, the display quality is degraded in some cases. Similarly, if electrical characteristics of transistors change over time, the display quality is degraded in some cases.

To prevent such degradation, a method of correcting variations and a change in electrical characteristics of transistors with a circuit that monitors electrical characteristics of the transistors in pixels is used. However, when electrical characteristics of the transistors connected to organic EL elements are monitored, the organic EL elements have to be in a non-light-emission state. Thus, electrical characteristics of the transistors need to be monitored in a short time so that the non-light-emission state is not visually recognized, and thus enough monitoring accuracy cannot be achieved. In other words, to monitor electrical characteristics of transistors with high accuracy, display quality is lowered temporarily.

In view of the foregoing problem, it is an object of one embodiment of the present invention to provide a light-emitting device in which electrical characteristics of a transistor in a pixel can be monitored without degrading display quality. Furthermore, it is an object to provide a light-emitting device with high display quality.

Note that the descriptions of these objects do not preclude the existence of other objects. Other objects will be apparent from and can be derived from the description of the specification, the drawings, the claims, and the like.

One embodiment of the present invention disclosed in this specification relates to an active matrix light-emitting device in which a pixel circuit included in one pixel can drive a light-emitting element in the pixel and a light-emitting element in another pixel.

One embodiment of the present invention is a light-emitting device that includes a plurality of pixels in N rows (N is a natural number of 3 or more) and M columns (M is a natural number of 1 or more) and a pixel circuit that drives a light-emitting element in each of the pixels. In the light-emitting device, a pixel in a first row does not include a light-emitting element, and pixels in second to N-th rows each include a light-emitting element. In each column, a pixel circuit included in the pixel in the first row is electrically connected to a light-emitting element included in the pixel in the second row through a first switch. In each column, a pixel circuit included in a pixel in a k-th row (k is a natural number greater than or equal to 2 and less than N) is electrically connected to a light-emitting element included in the pixel in the k-th row through a second switch and also to a light-emitting element included in a pixel in a (k+1)-th row through a third switch. In each column, a pixel circuit included in the pixel in the N-th row is electrically connected to a light-emitting element included in the pixel in the N-th row through a fourth switch.

In the above-described light-emitting device, each of the pixel circuits can include a first transistor, a second transistor, a third transistor, and a capacitor. In the light-emitting device, one of a source electrode and a drain electrode of the first transistor is electrically connected to a first wiring. The other of the source electrode and the drain electrode of the first transistor is electrically connected to a gate electrode of the second transistor and one electrode of the capacitor. One of a source electrode and a drain electrode of the second transistor is electrically connected to a second wiring. The other of the source electrode and the drain electrode of the second transistor is electrically connected to one of a source electrode and a drain electrode of the third transistor and the other electrode of the capacitor. The other of the source electrode and the drain electrode of the third transistor is electrically connected to a third wiring. A gate electrode of the first transistor and a gate electrode of the third transistor are electrically connected to a fourth wiring.

Here, the first wiring can be a wiring connected to a signal driver circuit, the second wiring can be a wiring connected to a power supply circuit, the third wiring can be a wiring connected to a correction circuit, and the fourth wiring can be a wiring connected to a first gate line driver circuit.

Further, the first switch can be a transistor. In the pixel circuit included in the pixel in the first row, the other of the source electrode and the drain electrode of the second transistor can be electrically connected to one of a source electrode and a drain electrode of the transistor used as the first switch. The other of the source electrode and the drain electrode of the transistor used as the first switch can be electrically connected to one electrode of the light-emitting element included in the pixel in the second row. A gate electrode of the transistor used as the first switch can be electrically connected to a fifth wiring.

Here, the fifth wiring is a wiring connected to a second gate line driver circuit.

Further, the second switch and the third switch can be transistors. In the pixel circuit included in the pixel in the k-th row, the other of the source electrode and the drain electrode of the second transistor can be electrically connected to one of a source electrode and a drain electrode of the transistor used as the second switch and one of a source electrode and a drain electrode of the transistor used as the third switch. The other of the source electrode and the drain electrode of the transistor used as the second switch can be electrically connected to one electrode of the light-emitting element included in the pixel in the k-th row. The other of the source electrode and the drain electrode of the transistor used as the third switch can be electrically connected to one electrode of the light-emitting element included in the pixel in the (k+1)-th row. A gate electrode of the transistor used as the second switch can be electrically connected to a sixth wiring. A gate electrode of the transistor used as the third switch can be electrically connected to a seventh wiring.

Here, the sixth wiring can be a wiring connected to a third gate line driver circuit, and the seventh wiring can be a wiring connected to the second gate line driver circuit.

Further, the fourth switch can be a transistor. In the pixel circuit included in the pixel in the N-th row, the other of the source electrode and the drain electrode of the second transistor can be electrically connected to one of a source electrode and a drain electrode of the transistor used as the fourth switch. The other of the source electrode and the drain electrode of the transistor used as the fourth switch can be electrically connected to one electrode of the light-emitting element included in the pixel in the N-th row. A gate electrode of the transistor used as the fourth switch can be electrically connected to an eighth wiring.

Here, the eighth wiring can be a wiring connected to the third gate line driver circuit.

With one embodiment of the present invention, electrical characteristics of a transistor in a pixel of a light-emitting device can be monitored without degrading display quality. Furthermore, a light-emitting device with high display quality can be provided.

Note that the description of these effects does not preclude the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

In the accompanying drawings:

FIGS. 8A to 8C each schematically illustrate a mode of connection among pixels in one column;

DETAILED DESCRIPTION OF THE INVENTION

Figure 1:
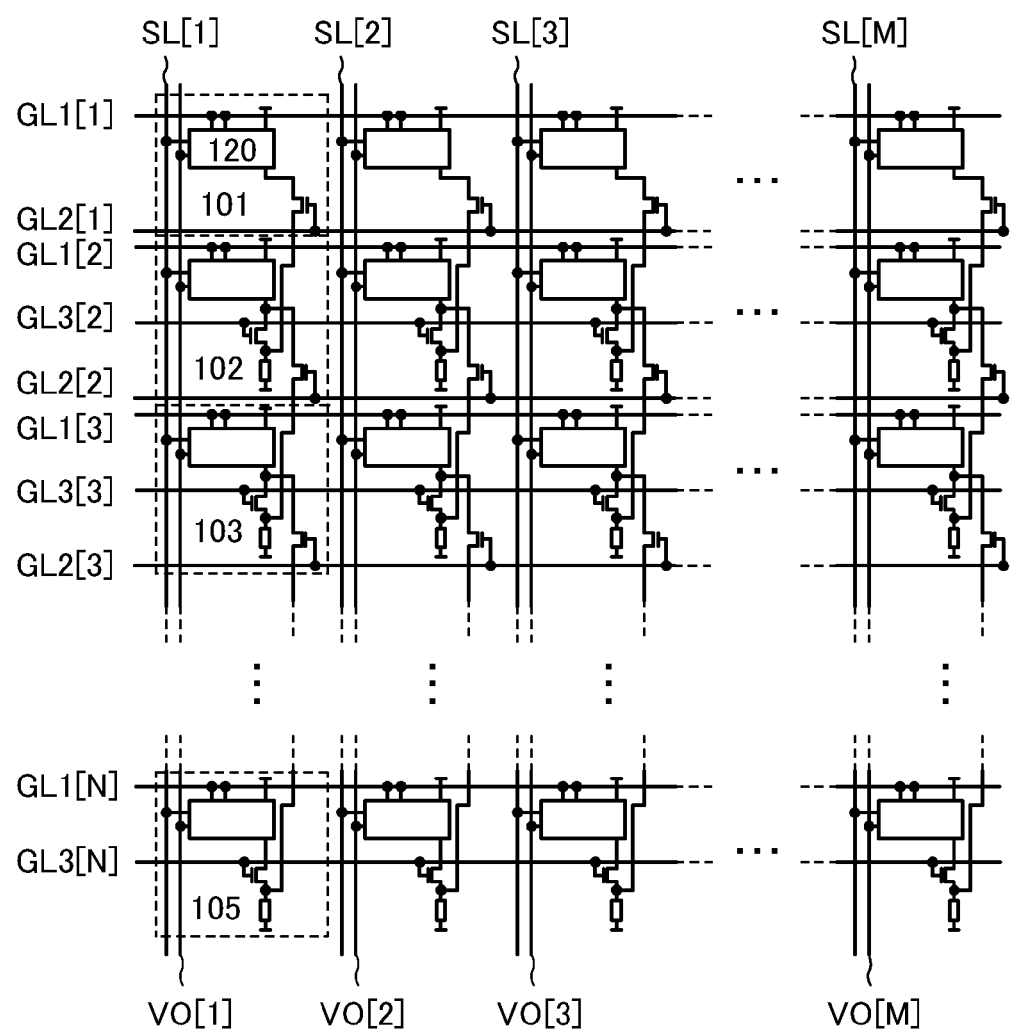
FIG. 1 illustrates a circuit configuration of a light-emitting device.

Embodiments will be described in detail with reference to the drawings. However, the present invention is not limited to the description below, and it is easily understood by those skilled in the art that modes and details disclosed herein can be modified in various ways without departing from the spirit and the scope of the present invention. Further, the present invention is not construed as being limited to the description of the embodiments below. Note that in structures of the present invention described below, the same portions or portions having similar functions are denoted by the same reference numerals in different drawings, and description thereof is not repeated in some cases.

Note that in this specification and the like, when it is explicitly described that X and Y are connected, the case where X and Y are electrically connected, the case where X and Y are functionally connected, and the case where X and Y are directly connected are included therein. Here, X and Y each denote an object (e.g., a device, an element, a circuit, a wiring, an electrode, a terminal, a conductive film, a layer, or the like). Accordingly, without limiting to a predetermined connection relation, for example, a connection relation shown in drawings and texts, another element may be interposed between elements having the connection relation shown in the drawings and the texts.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be turned on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit, and a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. When a signal output from X is transmitted to Y, it can be said that X and Y are functionally connected even if another circuit is provided between X and Y.

Note that when it is explicitly described that X and Y are connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that "A and B are electrically connected", the description is the same as the case where it is explicitly only described that "A and B are connected".

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification and the like, a transistor can be formed using a variety of substrates. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used. As examples of the glass substrate, a barium borosilicate glass substrate, an aluminoborosilicate glass substrate, a soda lime glass substrate, and the like can be given. For the flexible substrate, a flexible synthetic resin such as plastic typified by polyethylene terephthalate (PET), polyethylene naphthalate (PEN), and polyether sulfone (PES), or acrylic can be used, for example. For the attachment film, polypropylene, polyester, polyvinyl fluoride, polyvinyl chloride, or the like can be used, for example. For the base material film, polyester, polyamide, polyimide, an inorganic vapor deposition film, paper, or the like can be used, for example. Specifically, when a transistor is formed using a semiconductor substrate, a single crystal substrate, an SOI substrate, or the like, it is possible to form a transistor with few variations in characteristics, size, shape, or the like, with high current supply capability, and with a small size. By forming a circuit with the use of such a transistor, power consumption of the circuit can be reduced or the circuit can be highly integrated.

Note that a transistor may be formed using one substrate, and then the transistor may be transferred to another substrate. Other than the above-described examples of the substrate over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, or the like can be used as a substrate to which the transistor is transferred. By using such a substrate, a transistor with excellent characteristics or a transistor with low power consumption can be formed, a device with high durability can be formed, heat resistance can be provided, or reduction in weight or thickness can be achieved.

Note that in this specification, a light-emitting device refers to an image display device or a light source (including a lighting device). In addition, the light-emitting device includes any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted on a substrate over which a light-emitting element is formed by a chip on glass (COG) method.

Embodiment 1

In this embodiment, a configuration of a light-emitting device of one embodiment of the present invention will be described.

When variations or a change over time arise in electrical characteristics of transistors in pixels, the display quality of the light-emitting device is degraded in some cases.

Figure 2A:
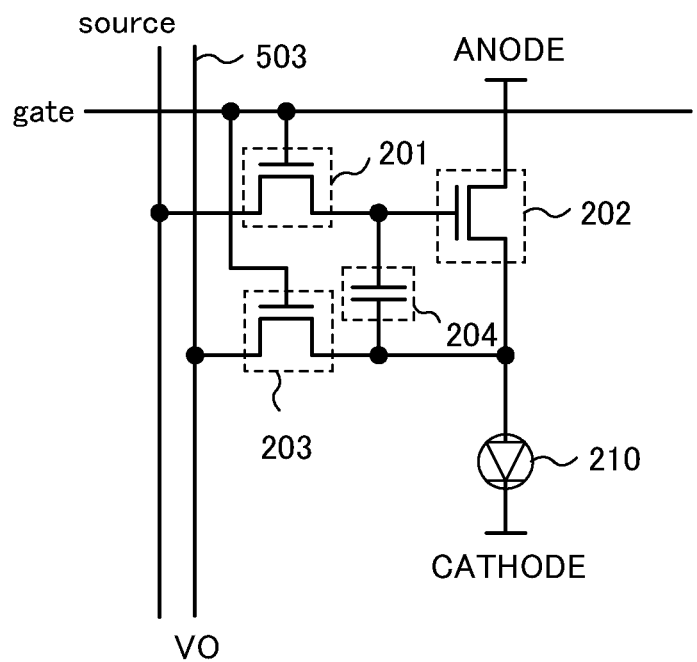
FIGS. 2A and 2B illustrate configurations of a pixel circuit and a correction circuit, respectively.
Figure 2B:
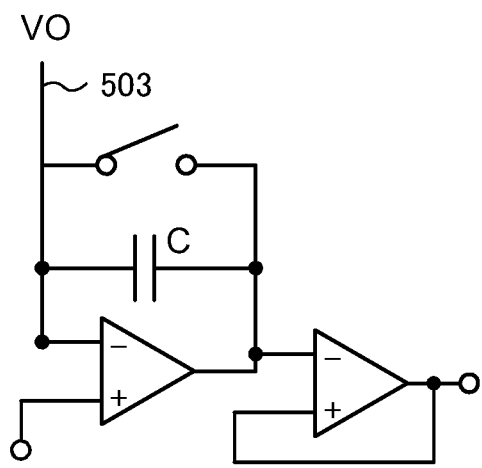

As a structure for preventing the degradation, a pixel circuit as illustrated in FIG. 2A that includes a first transistor 201 for switching a pixel, a second transistor 202 for controlling supply of current to a light-emitting element 210, and a third transistor 203 for switching the connection to a correction circuit such as an integrator circuit illustrated in FIG. 2B is known. The correction circuit monitors electrical characteristics of the second transistor 202 on a regular basis and generates a correction signal.

For example, when a change over time in electrical characteristics of the second transistor 202 arises, a data signal to which the correction signal generated by the correction circuit is added is supplied to a gate of the second transistor 202 to correct the amount of current flowing through the light-emitting element 210. In this manner, an unwanted change in luminance in the light-emitting element can be prevented.

At the time of monitoring electrical characteristics of the second transistor 202 with a correction circuit, the second transistor 202 needs to be operated at a voltage lower than a threshold voltage (forward voltage) at which the light-emitting element does not emit light. In addition, long monitoring time is preferable to obtain accurate data. In practice, however, electrical characteristics of the transistor need to be monitored in a short time so that the non-light-emission state is not visually recognized, and thus enough monitoring accuracy cannot be achieved. In other words, to monitor electrical characteristics of the transistor with high accuracy, display quality is lowered temporarily.

In view of the foregoing problem, it is an object of one embodiment of the present invention to provide a light-emitting device in which electrical characteristics of a transistor in a pixel can be monitored with high accuracy without degrading display quality.

FIG. 1 illustrates a circuit configuration of a light-emitting device of one embodiment of the present invention. The light-emitting device includes a plurality of pixels in N rows (N is a natural number of 3 or more) and M columns (M is a natural number of 1 or more). The pixels in the first row, the pixels in the k-th row (k is a natural number more than or equal to 2 and less than N), and the pixels in the N-th row have structures different from one another.

A pixel 101 in the first row does not include a light-emitting element, and a pixel 102, a pixel 103, and a pixel 105 in the second to N-th rows each include a light-emitting element. Note that a circuit 120 included in each pixel is a pixel circuit and can include the first transistor 201, the second transistor 202, the third transistor 203, and a capacitor 204 like the circuit illustrated in FIG. 2A.

Figure 3:
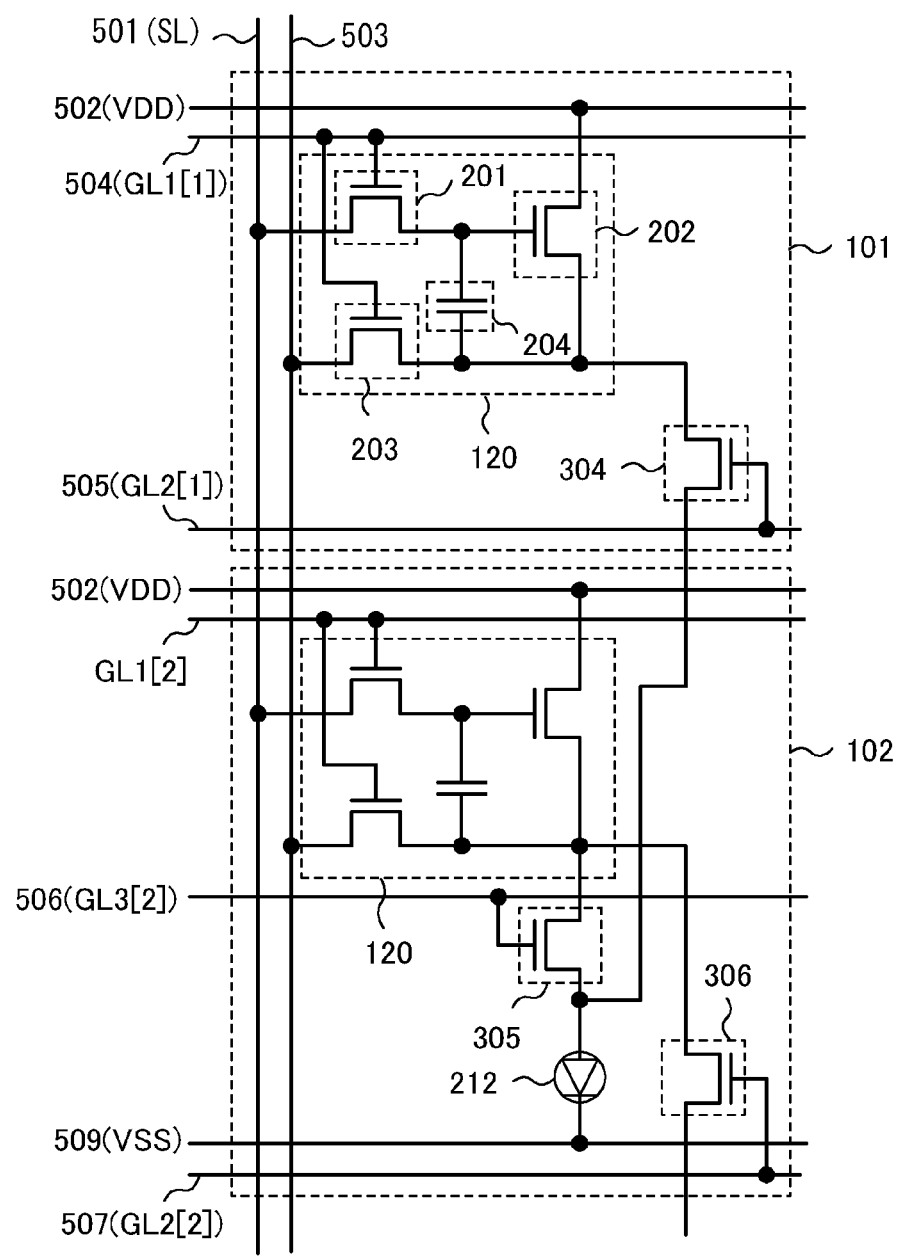
FIG. 3 illustrates a mode of connection between pixel circuits.

FIG. 3 specifically illustrates a connection relation between the pixel 101 in the first row and the pixel 102 in the second row. The pixel circuit included in the pixel in the first row is electrically connected to a light-emitting element 212 included in the pixel in the second row in the same column through a fourth transistor 304 that is a first switch.

In the pixel 101 in the first row, the pixel circuit used as the circuit 120 has the following configuration. One of a source electrode and a drain electrode of the first transistor 201 is electrically connected to a first wiring 501 (SL), and the other of the source electrode and the drain electrode of the first transistor 201 is electrically connected to a gate electrode of the second transistor 202 and one electrode of the capacitor 204. One of a source electrode and a drain electrode of the second transistor 202 is electrically connected to a second wiring 502 (VDD), and the other of the source electrode and the drain electrode of the second transistor 202 is electrically connected to one of a source electrode and a drain electrode of the third transistor 203 and the other electrode of the capacitor 204. The other of the source electrode and the drain electrode of the third transistor 203 is electrically connected to a third wiring 503 (VO). A gate electrode of the first transistor 201 and a gate electrode of the third transistor 203 are electrically connected to a fourth wiring 504 (GL1).

In the pixel circuit included in the pixel 101 in the first row, the other of the source electrode and the drain electrode of the second transistor 202 is electrically connected to one of a source electrode and a drain electrode of the fourth transistor 304 that is the first switch. The other of the source electrode and the drain electrode of the fourth transistor 304 is electrically connected to one electrode of the light-emitting element 212 included in the pixel 102 in the second row. A gate electrode of the fourth transistor 304 is electrically connected to a fifth wiring 505 (GL2). Note that the details of the pixel 102 in the second row will be described with reference to FIG. 4.

Figure 4:
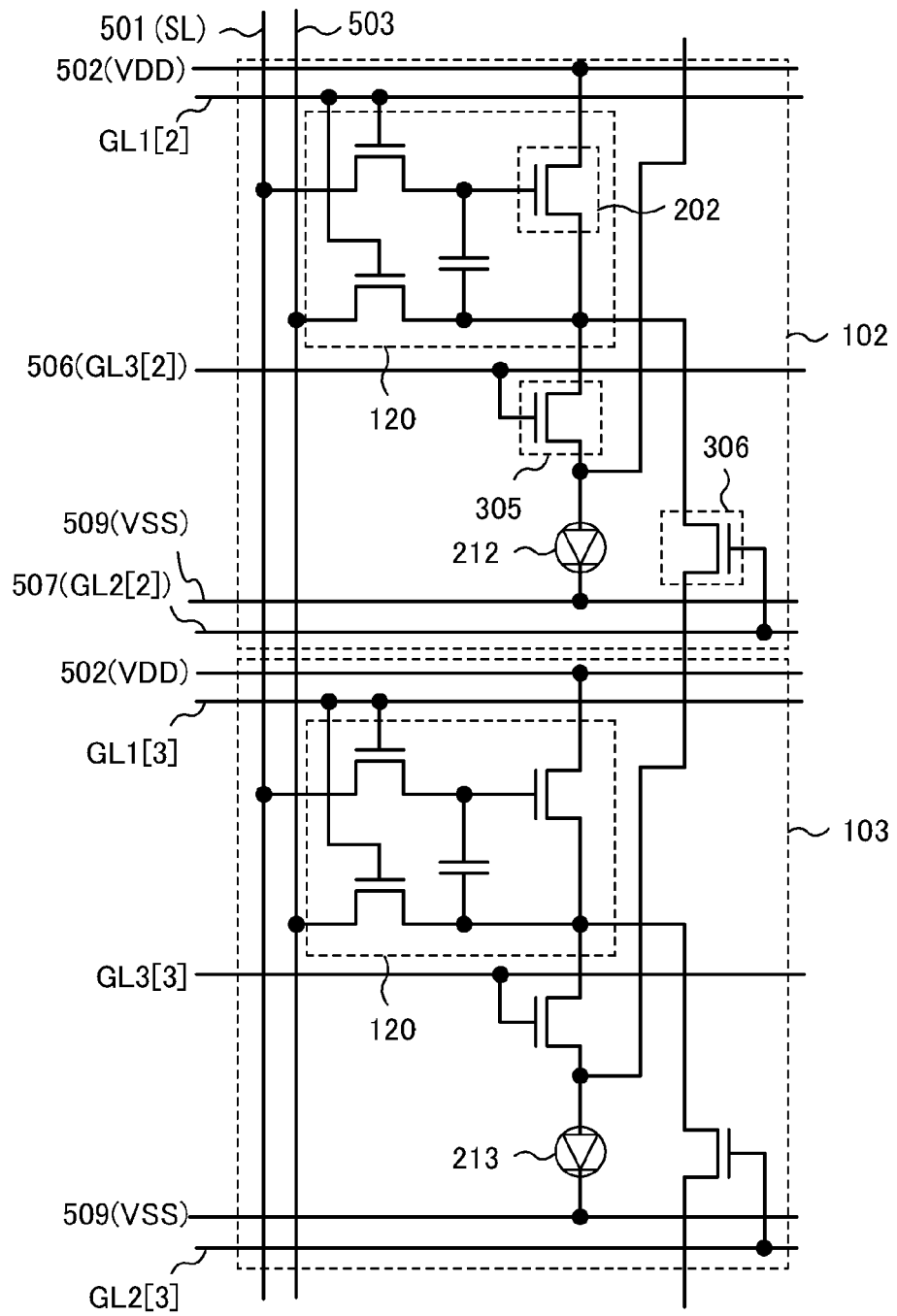
FIG. 4 illustrates a mode of connection between pixel circuits.

FIG. 4 specifically illustrates a connection relation between the pixel 102 in the second row and the pixel 103 in the third row. The pixel circuit included in the pixel 102 in the second row is electrically connected to the light-emitting element 212 included in the pixel 102 through a fifth transistor 305 that is a second switch. In addition, the pixel circuit included in the pixel 102 is electrically connected to a light-emitting element 213 included in the pixel 103 in the third row in the same column through a sixth transistor 306 that is a third switch.

In the pixel circuit included in the pixel 102 in the second row, the other of the source electrode and the drain electrode of the second transistor 202 is electrically connected to one of a source electrode and a drain electrode of the fifth transistor 305 that is the second switch and one of a source electrode and a drain electrode of the sixth transistor 306 that is the third switch. The other of the source electrode and the drain electrode of the fifth transistor 305 is electrically connected to one electrode of the light-emitting element 212 included in the pixel 102 in the second row. The other of the source electrode and the drain electrode of the sixth transistor 306 is electrically connected to one electrode of the light-emitting element 213 included in the pixel 103 in the third row. A gate electrode of the fifth transistor 305 is electrically connected to a sixth wiring 506 (GL3). A gate electrode of the sixth transistor 306 is electrically connected to a seventh wiring 507 (GL2). Note that the other electrode of each light-emitting element is electrically connected to a ninth wiring 509.

Note that the second row and the third row can be expressed as the k-th row (k is a natural number of more than or equal to 2 and less than N) and the (k+1)-th row, and the description of the connection relation between the second row and the third row can be understood as the description of the connection relation from the second row to the (N−1)-th row.

Figure 5:
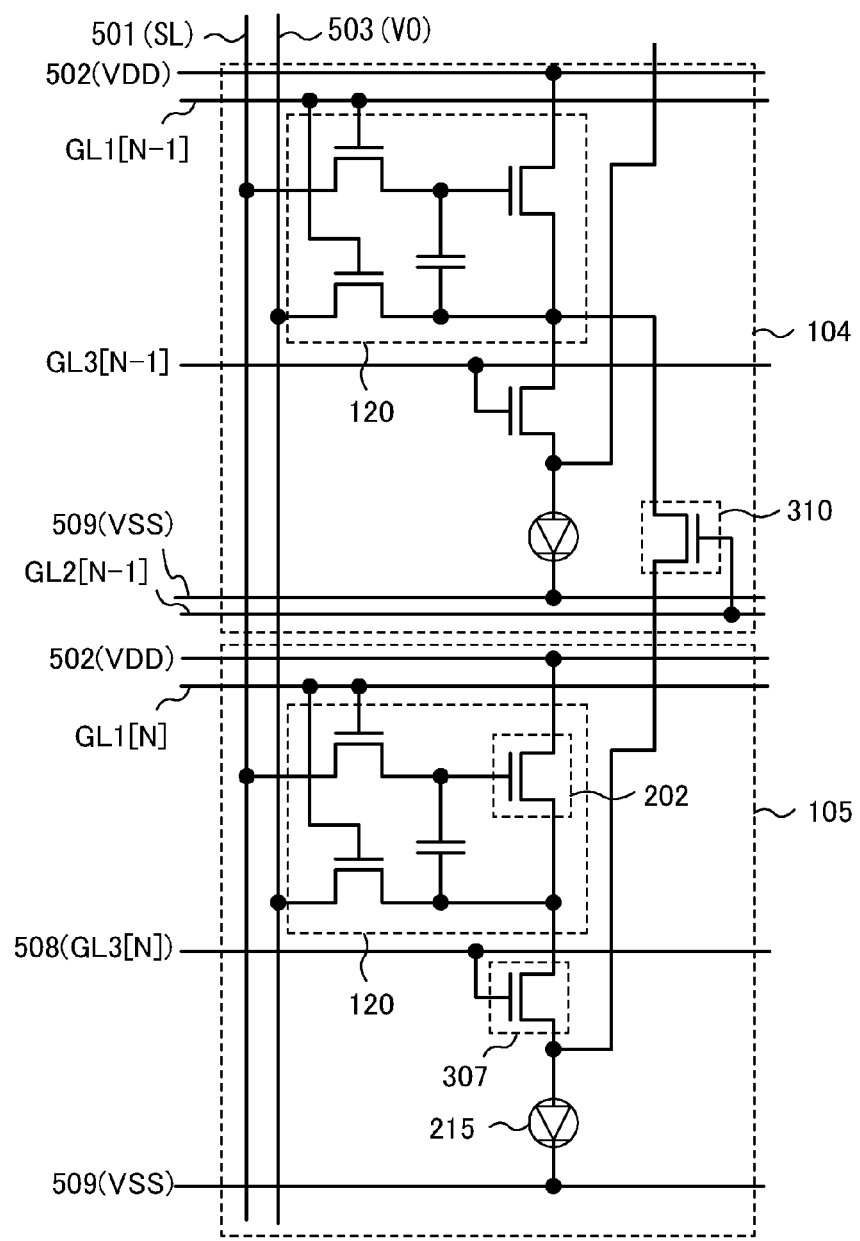
FIG. 5 illustrates a mode of connection between pixel circuits.

FIG. 5 specifically illustrates a connection relation between a pixel 104 in the (N−1)-th row and the pixel 105 in the N-th row. Note that the pixel 104 is not illustrated in FIG. 1. The pixel circuit included in the pixel 104 in the (N−1)-th row is electrically connected to a light-emitting element 215 in the pixel 105 in the N-th row in the same column through a tenth transistor 310 that is a seventh switch.

In the pixel circuit included in the pixel 105 in the N-th row, the other of the source electrode and the drain electrode of the second transistor 202 is electrically connected to one of a source electrode and a drain electrode of a seventh transistor 307 that is a fourth switch. The other of the source electrode and the drain electrode of the seventh transistor 307 is elec- trically connected to one electrode of the light-emitting element 215 included in the pixel in the N-th row. A gate electrode of the seventh transistor 307 is electrically connected to an eighth wiring 508 (GL3).

For example, in the above-described circuit configuration, the first wiring 501 (SL) is a wiring connected to a signal driver circuit, the second wiring 502 (VDD) is a wiring connected to a high potential supply circuit, the third wiring 503 (VO) is a wiring connected to a correction circuit (e.g., the correction circuit illustrated in FIG. 2B), the fourth wiring 504 (GL1) is a wiring connected to a first gate line driver circuit, the fifth wiring 505 (GL2) and the seventh wiring 507 (GL2) are wirings connected to a second gate line driver circuit, and the sixth wiring 506 (GL3) and the eighth wiring 508 (GL3) are wirings connected to a third gate line driver circuit. Further, the ninth wiring 509 (VSS) may be a wiring connected to a lower potential supply circuit or a ground wiring.

Figure 6:
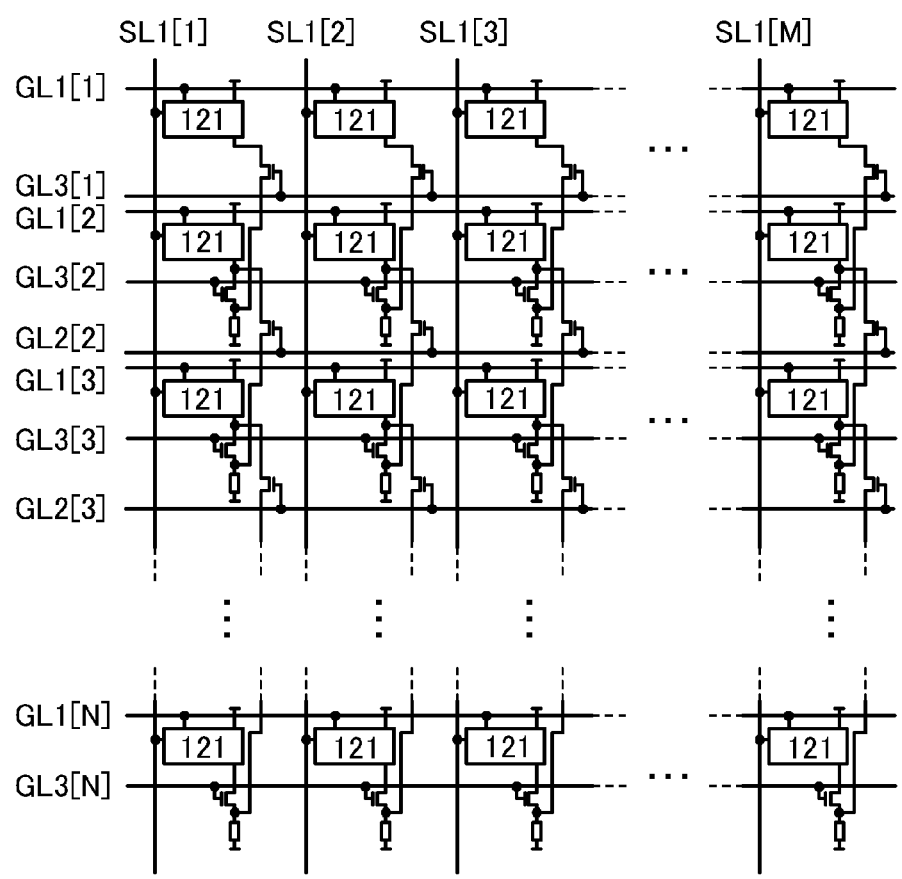
FIG. 6 illustrates a circuit configuration of a light-emitting device.

Note that the configuration of the pixel circuits is not limited to the configuration described above. In addition, the mode of connection between the correction circuit and the pixel circuits is not limited to the mode described above. One embodiment of the present invention is characterized by including switches with which pixel circuits for driving light-emitting elements are selected. Thus, the configuration of the light-emitting device can also be illustrated as in FIG. 6. Here, a pixel circuit 121 has an arbitrary configuration including a circuit for switching the pixel and a circuit for controlling the amount of current flowing through a light-emitting element. Furthermore, the pixel circuit 121 can include a switching element for connecting the correction circuit to the pixel circuit 121.

Next, an example of a method for monitoring electrical characteristics of the second transistor 202 with high accuracy without degrading display quality by using a light-emitting device of one embodiment of the present invention will be described.

Figure 7A:
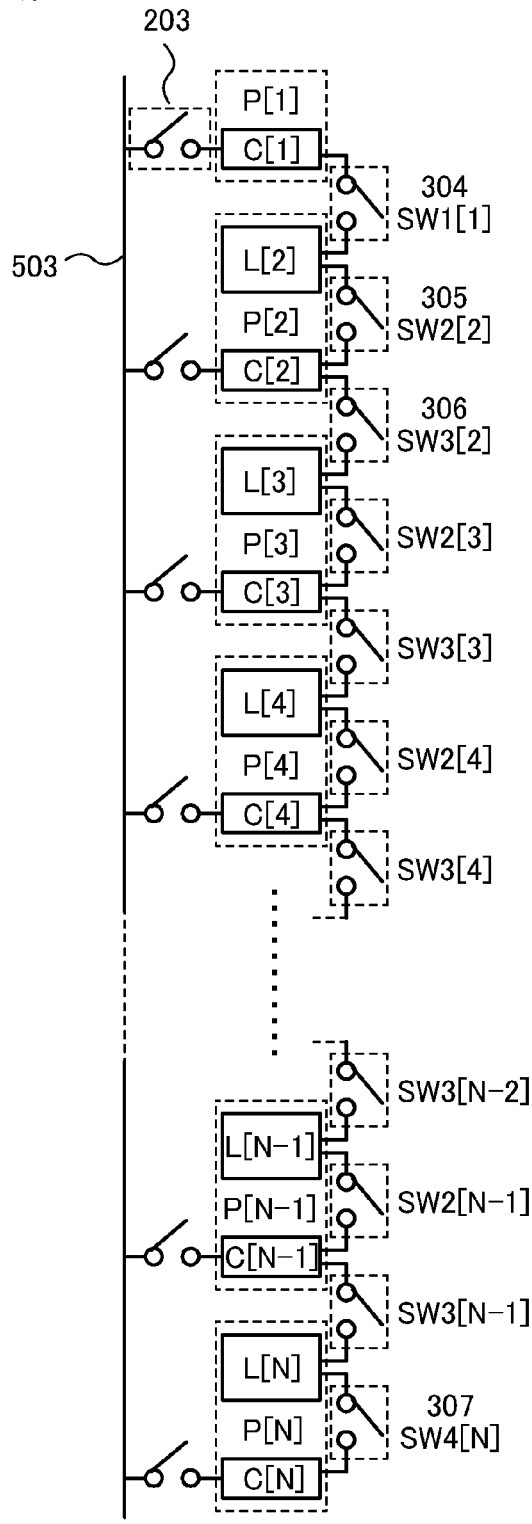
FIGS. 7A and 7B each schematically illustrate a mode of connection among pixels in one column.

FIG. 7A schematically illustrates a mode of connection among pixels in one column illustrated in FIG. 1. P represents a pixel, L represents a light-emitting element, and C represents a pixel circuit. The respective pixel circuits are connected to the third wiring 503 by the third transistors 203. Of the switches for connecting pixel circuits to light-emitting elements (SW1[1], SW2[2] to SW2[N−1], SW3[2] to SW3[N−1] and SW4[N]), only the switches (transistors) corresponding to the switches illustrated in FIG. 3, FIG. 4, and FIG. 5 are denoted by the same reference numerals used in FIG. 3, FIG. 4, and FIG. 5. Although the third transistors 203 are part of the pixel circuits in FIGS. 2A and 2B, FIG. 3, FIG. 4, and FIG. 5, the third transistors 203 are here regarded as switches for connecting the pixel circuits (the first transistor 201, the second transistor 202, and the capacitor 204) to the third wiring 503. As described above, the correction circuit is connected to the third wiring 503.

In FIG. 7A, all of the switches are off, that is, the light-emitting device is not operating.

Figure 7B:
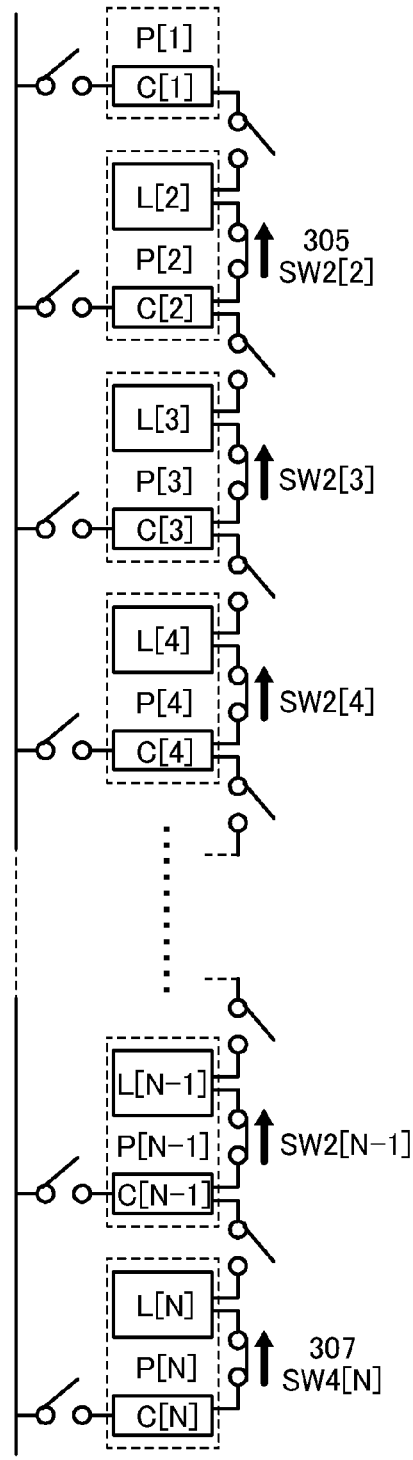

FIG. 7B illustrates an example of a state in which electrical characteristics of the second transistors 202 are not monitored in any of the pixel circuits. In FIG. 7B, SW2[2], SW2[3], SW2[4], SW2[N−1], and SW4[N] are on, so that the light-emitting elements in the pixels are driven by the pixel circuits in their respective pixels. Here, the pixel circuit C[1] in P[1] does not contribute to driving of a light-emitting element.

Note that the state in which electrical characteristics of the second transistors 202 are not monitored can be created by various modes other than the mode illustrated in FIG. 7B. For example, when SW1[1] is on, SW2[2] is off, and the other switches are in the same state as the switches in FIG. 7B, the pixel circuit C[1] can drive the light-emitting element L[2] in P[2] and the pixel circuit C[2] in P[2] does not contribute to driving of the light-emitting element.

FIG. 8A illustrates a state of monitoring electrical characteristics of the second transistor 202 in the pixel circuit C[1] in P[1]. By turning on the third transistor 203 to connect the third wiring 503 to the pixel circuit C[1], electrical characteristics of the second transistor 202 included in the pixel circuit C[1] are monitored.

At this time, the other pixels are in a state similar to that illustrated in FIG. 7B, that is, the state in which the light-emitting elements in the pixels are driven by the pixel circuits in their respective pixels. Therefore, electrical characteristics of the second transistor 202 included in the pixel circuit C[1] can be monitored independently of light emission of the light-emitting elements, that is, display of the light-emitting device. Therefore, enough monitoring time can be ensured.

FIG. 8B illustrates a state of monitoring electrical characteristics of the second transistor 202 in the pixel circuit C[3] in P[3]. By turning on the third transistor 203 to connect the third wiring 503 to the pixel circuit C[3], the monitoring is performed.

At this time, SW3[2] is on, so that the light-emitting element L[3] included in P[3] is driven by the pixel circuit C[2] included in P[2]. In addition, SW1[1] is on, so that the light-emitting element L[2] included in P[2] is driven by the pixel circuit C[1] included in P[1]. Furthermore, the light-emitting elements in the pixels P[4] to P[N] are driven by the pixel circuits in their respective pixels. Therefore, electrical characteristics of the second transistor 202 included in the pixel circuit C[3] can be monitored independently of light emission of the light-emitting elements, that is, display of the light-emitting device.

FIG. 8C illustrates a state of monitoring electrical characteristics of the second transistor 202 in the pixel circuit C[N] in P[N]. By turning on the third transistor 203 to connect the third wiring 503 to the pixel circuit C[N], the monitoring is performed.

At this time, SW3[N−1] is on, so that the light-emitting element L[N] included in P[N] is driven by the pixel circuit C[N−1] included in P[N−1]. In addition, SW3[N−2] is on, so that the light-emitting element L[N−1] included in P[N−1] is driven by the pixel circuit C[N−2] (not illustrated) included in P[N−2] (not illustrated). Furthermore, SW3[3] is on, so that the light-emitting element L[4] included in P[4] is driven by the pixel circuit C[3] included in P[3]. Moreover, SW3[2] is on, so that the light-emitting element L[3] included in P[3] is driven by the pixel circuit C[2] included in P[2]. Furthermore, SW1[1] is on, so that the light-emitting element L[2] included in P[2] is driven by the pixel circuit C[1] included in P[1]. Therefore, electrical characteristics of the second transistor 202 included in the pixel circuit C[N] can be monitored independently of light emission of the light-emitting elements, that is, display of the light-emitting device.

As described above, a light-emitting element can be driven by either of two pixel circuits in the light-emitting device of one embodiment of the present invention; accordingly, electrical characteristics of the second transistor 202 can be monitored independently of light emission of the light-emitting element. Thus, enough monitoring time can be ensured. Furthermore, the monitoring can be performed without influencing display of the light-emitting device.

Figure 9:
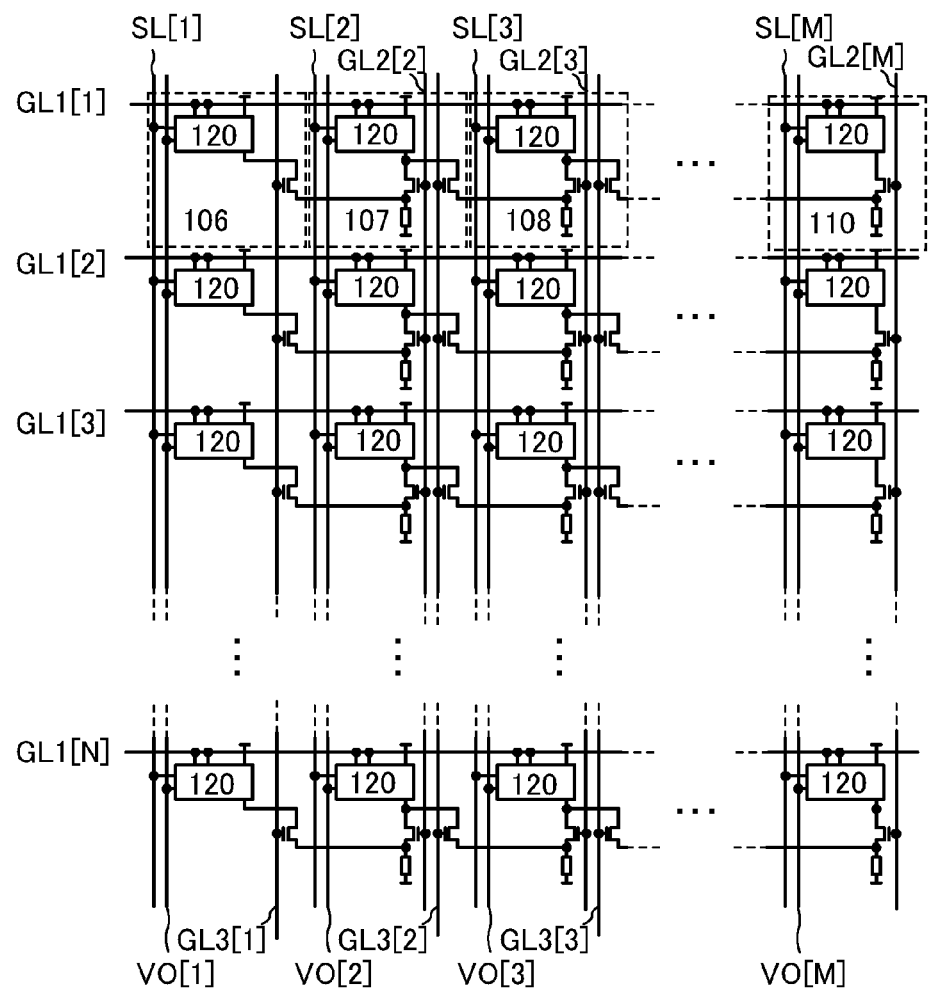
FIG. 9 illustrates a circuit configuration of a light-emitting device.

Note that a light-emitting device of one embodiment of the present invention may have a circuit configuration illustrated in FIG. 9. The light-emitting device illustrated in FIG. 1 has a structure of sharing a pixel circuit between pixels in adjacent rows, while the light-emitting device illustrated in FIG. 9 has a structure of sharing a pixel circuit between pixels in adjacent columns.

The light-emitting device includes a plurality of pixels in N rows (N is a natural number of 1 or more) and M columns (M is a natural number of 3 or more). The pixels in the first column, the pixels in the J-th column (J is a natural number more than or equal to 2 and less than M), and the pixels in the M-th column have different structures from one another. Wirings similar to those in the light-emitting device illustrated in FIG. 1 are included, and the above description can be referred to for the details of the wirings.

A pixel 106 in the first column does not include a light-emitting element, and a pixel 107, a pixel 108, and a pixel 110 in the second to J-th columns each include a light-emitting element. Note that the circuit 120 included in each pixel is a pixel circuit and may include the first transistor 201, the second transistor 202, the third transistor 203, and the capacitor 204 like the circuit illustrated in FIG. 2A.

Figure 10:
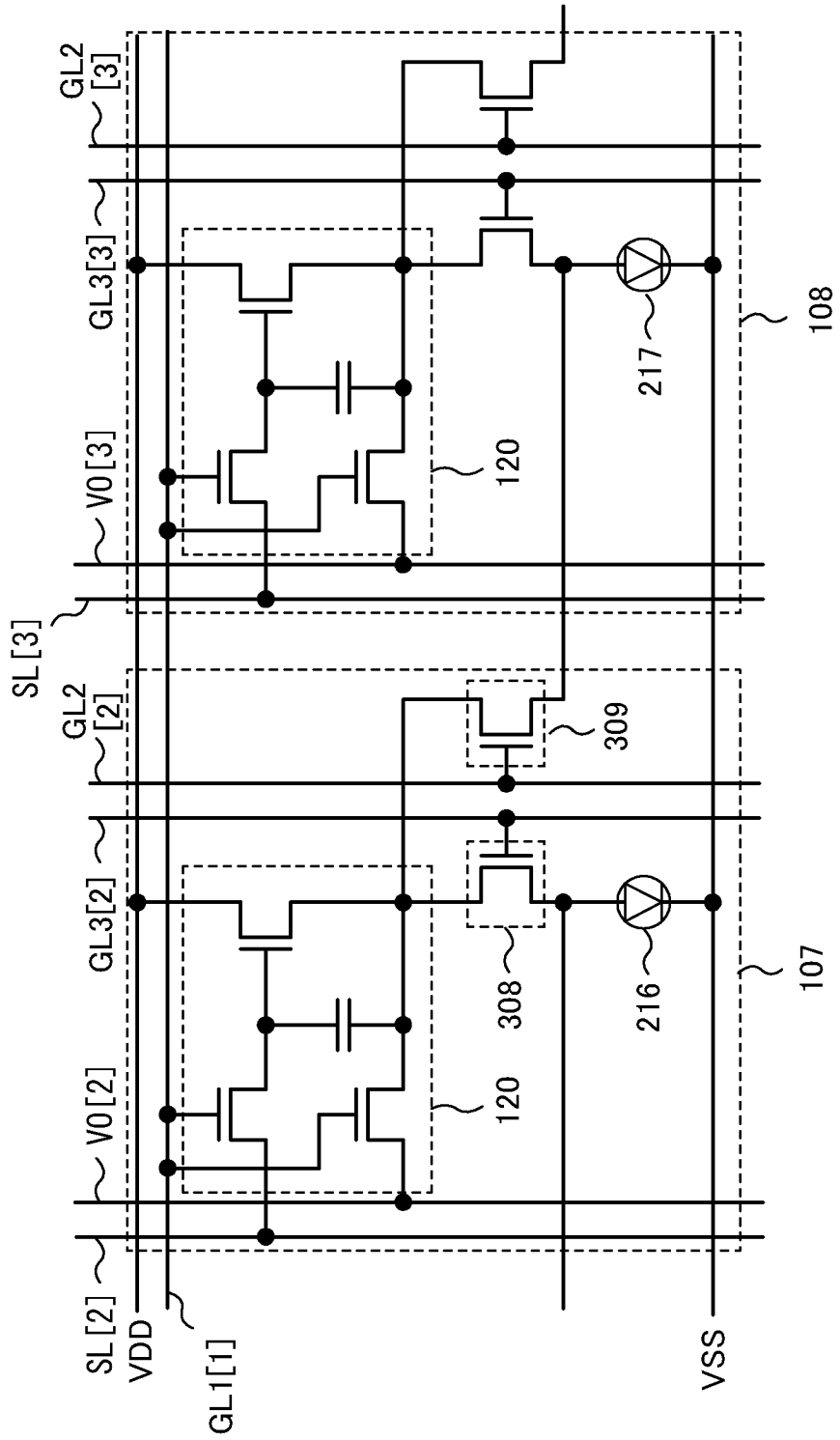
FIG. 10 illustrates a mode of connection between pixel circuits.

FIG. 10 specifically illustrates a connection relation between the pixel 107 in the second column and the pixel 108 in the third column. The pixel circuit included in the pixel 107 in the second column is electrically connected to a light-emitting element 216 included in the pixel 107 through an eighth transistor 308 that is a fifth switch. In addition, the pixel circuit included in the pixel 107 is electrically connected to a light-emitting element 217 included in the pixel 108 in the third column in the same row through a ninth transistor 309 that is a sixth switch.

Figure 11:
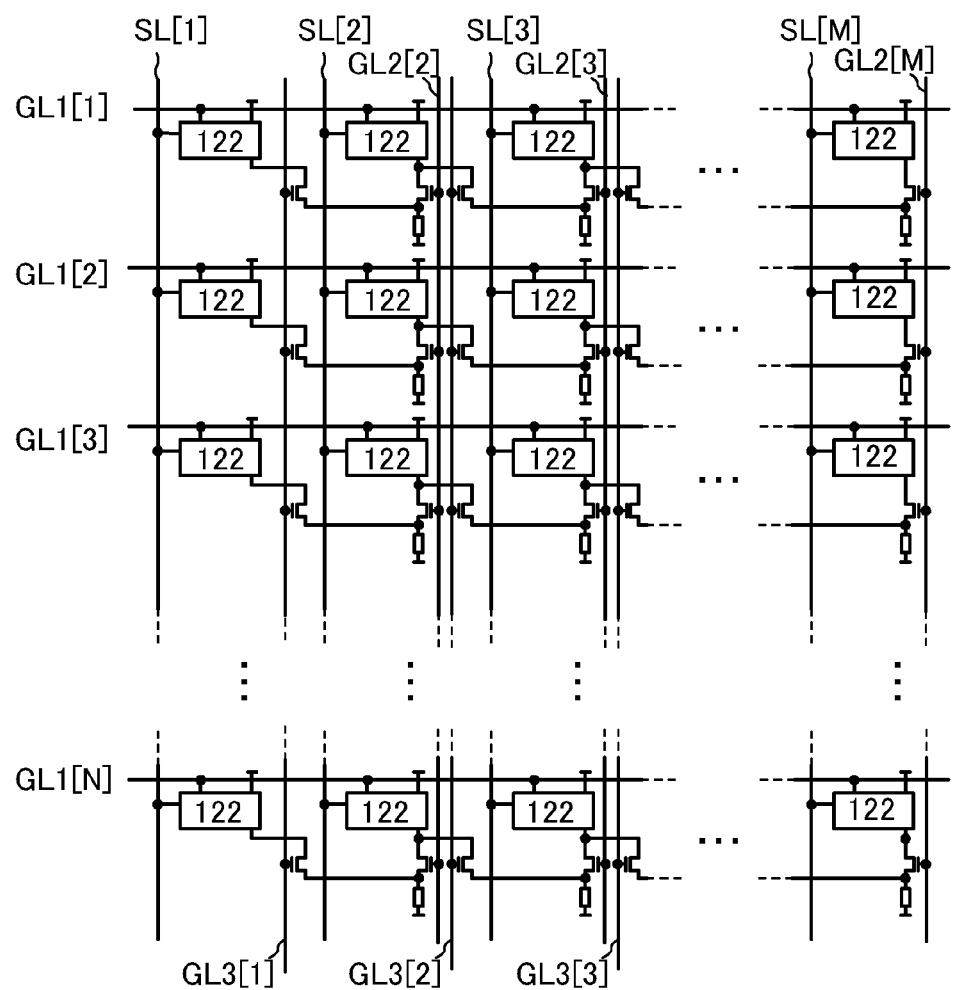
FIG. 11 illustrates a circuit configuration of a light-emitting device.

Note that the configuration of the pixel circuits is not limited to the configuration described above. In addition, the mode of connection between the correction circuit and the pixel circuits is not limited to the mode described above. One embodiment of the present invention is characterized by including switches with which pixel circuits for driving light-emitting elements are selected. Thus, the configuration of the light-emitting device can also be illustrated as in FIG. 11. Here, a pixel circuit 122 has an arbitrary configuration including a circuit for switching the pixel and a circuit for controlling the amount of current flowing through a light-emitting element. Furthermore, the pixel circuit 122 can include a switching element for connecting the correction circuit to the pixel circuit 122.

An operation similar to that performed by the light-emitting device of one embodiment of the present invention is achieved by providing two pixel circuits in one pixel and switching operation between two pixel circuits. However, to perform correction with this configuration, a memory that stores data for double the number of pixels is required. On the other hand, the light-emitting device of one embodiment of the present invention requires a memory that stores data for only pixels including light-emitting elements and pixels not including light-emitting elements (pixels in one row); accordingly, correction can be performed with a memory with smaller storage capacity.

This embodiment can be implemented in combination with any of the other embodiments in this specification as appropriate.

Embodiment 2

In this embodiment, an example of an active matrix light-emitting device that is one embodiment of the present invention will be described with reference to FIGS. 12A and 12B.

Figure 12A:
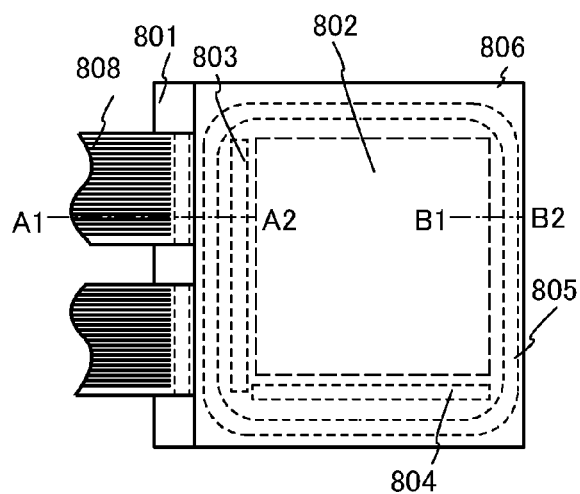
FIGS. 12A and 12B are a plan view and a cross-sectional view, respectively, of a light-emitting device.

FIG. 12A is a plan view of a light-emitting device of one embodiment of the present invention. FIG. 12B is a cross-sectional view taken along the alternate long and short dashed lines A1-A2 and B1-B2 in FIG. 12A.

Figure 12B:
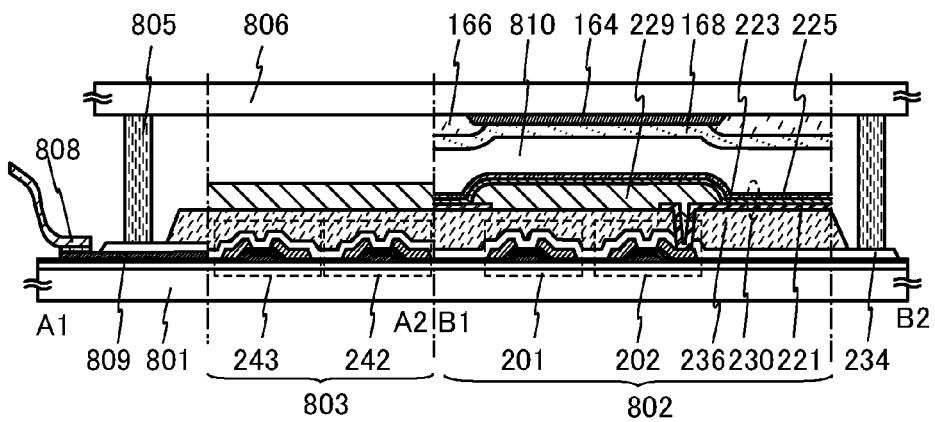

An active matrix light-emitting device illustrated in FIGS. 12A and 12B includes, over a support substrate 801, a light-emitting portion 802, a driver circuit portion 803 (e.g., gate line driver circuit), a driver circuit portion 804 (e.g., source line driver circuit), and a sealant 805. The light-emitting portion 802 and the driver circuit portions 803 and 804 are sealed in a space 810 surrounded by the support substrate 801, the sealing substrate 806, and the sealant 805.

The driver circuit portion 803 can include the first to third gate line driver circuits described in Embodiment 1. Further, the driver circuit portion 804 can include the signal line driver circuit and the correction circuit described in Embodiment 1. Note that the driver circuit portions may each be divided so that parts of the driver circuit portions face each other with pixels provided therebetween.

The light-emitting portion 802 illustrated in FIG. 12B includes a plurality of pixels each including a switching first transistor 201, a current control second transistor 202, and a first electrode 221 electrically connected to a wiring (a source electrode or a drain electrode) of the second transistor 202.

The light-emitting element 230 has a top emission structure, including the first electrode 221, an EL layer 223, and a second electrode 225. A partition wall 229 is formed to cover an end portion of the first electrode 221.

Over the support substrate 801, a lead wiring 809 for connecting an external input terminal through which a signal (e.g., a video signal, a clock signal, a start signal, or a reset signal) or a potential from the outside is transmitted to the driver circuit portions 803 and 804 is provided. Here, an example in which a flexible printed circuit (FPC) 808 is provided as an external input wiring is described.

The driver circuit portions 803 and 804 have a plurality of transistors. FIG. 12B illustrates an example in which the driver circuit portion 803 has a CMOS circuit which is a combination of an n-channel transistor 242 and a p-channel transistor 243. A circuit included in the driver circuit portion can be formed with various types of circuits such as a CMOS circuit, a PMOS circuit, or an NMOS circuit. Although a driver-integrated type in which a driver circuit is formed over the substrate over which the light-emitting portion is formed is described in this embodiment, the structure of the present invention is not limited to the driver-integrated type. The driver circuit can be formed over a substrate that is different from the substrate over which the light-emitting portion is formed.

To prevent an increase in the number of manufacturing steps, the lead wiring 809 is preferably formed using the same material in the same step(s) as those of the electrode or the wiring in the light-emitting portion or the driver circuit portion. For example, the lead wiring 809 can be formed using the same material in the same step(s) as those of the gate electrode of the transistor included in the light-emitting portion 802 and the driver circuit portion 803.

As the support substrate 801, a substrate having heat resistance high enough to resist the manufacturing process of the light-emitting device can be used. The substrate is not particularly limited in thickness and size as long as it can be used in a manufacturing apparatus.

The support substrate 801 preferably has a gas barrier property. A film having a gas barrier property may be stacked. Specifically, when a material having a gas barrier property such that the vapor permeability is lower than or equal to $10^{-5}$ g/m²×day, preferably lower than or equal to $10^{-6}$ g/m²×day, is used, the reliability of the light-emitting device can be improved.

Further, the support substrate 801 may be a flexible substrate. As a flexible substrate, a plastic substrate can be typically given as an example. In addition, a thin glass substrate with a thickness of greater than or equal to 50 μm and less than or equal to 500 μm, a metal foil, or the like can be used.

For example, as a substrate which can be used as the support substrate 801, a non-alkali glass substrate, a barium borosilicate glass substrate, an aluminoborosilicate glass substrate, a ceramic substrate, a quartz substrate, a sapphire substrate, a metal substrate, a stainless-steel substrate, a plastic substrate, a polyethylene terephthalate substrate, a polyimide substrate, or the like can be used.

The structure of the transistors in the light-emitting device is not particularly limited. Although transistors having a channel-etched bottom gate structure are illustrated as an example in FIG. 12B, the transistors may have a channel-protective bottom gate structure, a self-aligned top gate structure, or a non-self-aligned top gate structure.

Any of a variety of semiconductor materials can be used for a region where a channel of a transistor is formed. Specifically, amorphous silicon, microcrystalline silicon, polycrystalline silicon, single-crystal silicon, an oxide semiconductor including at least one of indium, gallium, and zinc, or the like can be used.

A transistor including an oxide semiconductor in a channel formation region has characteristics of very small off-state current. When such a transistor is used, the capability of holding a signal input to a pixel (capacitor) can be high, so that the frame frequency can be reduced for example in the case of displaying a still image. Low frame frequency enables a reduction in power consumption of the light-emitting device.

As the partition wall 229, a resin or an inorganic insulating material can be used. As the resin, for example, a polyimide resin, a polyamide resin, an acrylic resin, a siloxane resin, an epoxy resin, or a phenol resin can be used. To easily form the partition wall 229, a photocurable resin is preferably used.

The partition wall 229 is provided so as to cover an end portion of the first electrode 221. The partition wall 229 is preferably formed to have a curved side surface in order to improve the coverage with the EL layer 223 or the second electrode 225 which is formed over the partition wall 229.

There is no particular limitation to the method for forming the partition wall; a photolithography method, a sputtering method, an evaporation method, a droplet discharging method (e.g., an inkjet method), a printing method (e.g., a screen printing method or an off-set printing method), or the like can be used.

The partition wall 229 is preferably formed using a material having a lower refractive index than the EL layer 223. When the partition wall 229 is formed using such a material, total reflection can be caused at an interface between the EL layer 223 and the partition wall 229 and the amount of light entering the partition wall 229 can be reduced, whereby light extraction efficiency can be increased.

A light-emitting element included in the light-emitting device includes a pair of electrodes (the first electrode 221 and the second electrode 225); and the EL layer 223 between the pair of electrodes. One of the pair of electrodes functions as an anode and the other functions as a cathode.

In the case where the light-emitting element has a top emission structure, a conductive film that transmits visible light is used for an upper electrode, and a conductive film that reflects visible light is preferably used for a lower electrode. In the case where the light-emitting element has a bottom emission structure, a conductive film that transmits visible light is used for a lower electrode, and a conductive film that reflects visible light is preferably used for an upper electrode. In the case where the light-emitting element has a dual emission structure, a conductive film that transmits visible light is used for upper and lower electrodes.

The conductive film that transmits visible light can be formed using, for example, indium oxide, indium tin oxide, indium zinc oxide, zinc oxide, or zinc oxide to which gallium is added. Alternatively, a film of a metal material such as gold, platinum, nickel, tungsten, chromium, molybdenum, iron, cobalt, copper, palladium, or titanium, or a nitride of any of these metal materials (e.g., titanium nitride) which has a small thickness to transmit light can be used. Further alternatively, graphene or the like can be used.

The conductive film that reflects visible light can be formed using, for example, a metal material such as aluminum, gold, platinum, silver, nickel, tungsten, chromium, molybdenum, iron, cobalt, copper, or palladium; an aluminum-containing alloy (aluminum alloy) such as an alloy of aluminum and titanium, an alloy of aluminum and nickel, or an alloy of aluminum and neodymium; or a silver-containing alloy such as an alloy of silver and copper. An alloy of silver and copper is preferable because of its high heat resistance. Further, lanthanum, neodymium, or germanium may be added to the metal material or the alloy. Alternatively, a conductive resin material such as a silver paste can be used.

The first electrode 221 and the second electrode 225 can be formed by a vacuum evaporation method or a sputtering method. In the case of using a conductive resin material, a printing method or an ink-jet method can be used.

When a voltage higher than the threshold voltage of the light-emitting element is applied between the first electrode 221 and the second electrode 225, holes are injected from the first electrode 221 side to the EL layer 223 and electrons are injected from the second electrode 225 side to the EL layer 223. The injected electrons and holes are recombined in the EL layer 223 and a light-emitting substance contained in the EL layer 223 emits light.

The EL layer 223 includes a light-emitting layer. In addition to the light-emitting layer, the EL layer 223 may further include one or more layers containing any of the following substances: a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 123, either a low molecular compound or a high molecular compound can be used, and an inorganic compound may also be used. The above-described layers included in the EL layer 223 can be formed separately by any of the following methods: an evaporation method (including a vacuum evaporation method), a transfer method, a printing method, an inkjet method, a coating method, and the like.

With the first electrode 221 and the second electrode 225 of the light-emitting element 230, a microresonator (also referred to as microcavity) can be formed. For example, the first electrode 221 is formed using a conductive film which reflects light emitted from the EL layer 223, and the second electrode 225 is formed using a semi-transmissive and semi-reflective, conductive film which reflects part of the light and transmits part of the light.

In addition, an optical adjustment layer can be provided between the first and second electrodes 221 and 225. The optical adjustment layer adjusts the optical path length between the reflective first electrode 221 and the semi-transmissive and semi-reflective second electrode 225. By adjustment of the thickness of the optical adjustment layer, the wavelength of light which is preferentially extracted through the second electrode 225 can be controlled.

The EL layer can be employed for a material that can be used for the optical adjustment layer. For example, a charge generation region may be used to adjust the thickness of the optical adjustment layer. A region containing a substance having a high hole-transport property and an acceptor substance is especially preferably used for the optical adjustment layer, in which case an increase in drive voltage can be inhibited even when the optical adjustment layer is thick.

Alternatively, for a material that can be used for the optical adjustment layer, a conductive light-transmitting film that transmits light emitted from the EL layer 223 can also be employed. For example, a conductive light-transmitting film is stacked over a surface of a reflective conductive film so that the first electrode 221 can be formed. This structure is preferable because the thickness of the optical adjustment layer can be easily varied between the adjacent first electrodes 221.

An insulating layer 234 is provided to prevent diffusion of impurities into a semiconductor included in the transistor. As the insulating layer 234, an inorganic insulating film such as a silicon oxide film, a silicon oxynitride film, or an aluminum oxide film can be used.

As an insulating layer 236, an insulating film having a planarization function is preferably selected in order to reduce surface unevenness due to the transistor. For example, an organic material such as a polyimide resin, an acrylic resin, or a benzocyclobutene resin can be used. Other than such organic materials, a low-dielectric constant material (a low-k material) or the like can also be used. Note that a plurality of layers of any of these materials may be stacked to form the insulating layer 236.

The sealant 805 and the sealing substrate 806 are desirably formed using a material which does not transmit impurities in the air (such as water and/or oxygen) as much as possible. An epoxy-based resin, glass frit, or the like can be used for the sealant 805.

For a material that can be used for the sealing substrate 806, any of the substrate that can be used as the support substrate 801, a plastic substrate formed of polyvinil fluoride (PVF), polyester, acrylic, or the like, fiberglass-reinforced plastics (FRP), or the like can be used.

A light-transmitting material may be contained in the space 810 where the structure formed on the support substrate 801 side and the structure formed on the sealing substrate 806 side are not in contact with each other.

The light-transmitting material may be a material that reacts with or adsorbs impurities (such as water and/or hydrogen) which lower the reliability of the light-emitting element. Thus, impurities preferentially react with or are preferentially adsorbed by the material contained in the space 810 and become inactive before lowering the reliability of the light-emitting element. Accordingly, reliability of the light-emitting device can be increased.

As the light-transmitting material, a substance having a high hole-transport property, a light-emitting substance, a host material, a substance having a high electron-transport property, a substance having a high electron-injection property, an accepter substance, and/or the like can be used.

Specifically, a conductive high molecule, poly(3,4-ethylenedioxythiophene)/poly(styrenesulfonic acid) (PEDOT/PSS), a desiccating agent, a material which can be used in the EL layer 223, 4,4'-bis[N-(1-naphthyl)-N-phenylamino]biphenyl (abbreviation: NPB or a-NPD), tris(8-quinolinolato) aluminum(III) (abbreviation: Alq), or the like can be used.

The light-transmitting material can optically connect the second electrode 225 to the sealing substrate 806 (including the structure formed on the sealing substrate 806). Accordingly, a drastic change in the refractive index (also referred to as a step portion in the refractive index) of light emitted from the light-emitting element 230 can be suppressed in the optical path from the second electrode 225 to the sealing substrate 806, whereby light of the light-emitting element 230 can be efficiently extracted to the sealing substrate 806 through the second electrode 225. Thus, luminous efficiency of the light-emitting device can be improved.

The light-transmitting material is preferably a material having a higher refractive index than the second electrode 225. With such a material, total reflection at an interface between the second electrode 225 and the material can be inhibited, whereby light extraction efficiency can be increased.

Note that as the material that can optically connect the second electrode 225 to the sealing substrate 806, as well as the above-described materials, a liquid crystal material, a fluorine-based inactive liquid (such as perfluorocarbon), or a light-transmitting resin can be used. These materials may be used after impurities which lower the reliability of the light-emitting element are removed therefrom, as appropriate. In addition, a material that reacts with or adsorbs the impurities may be dispersed in the above materials.

As examples of a liquid crystal material, any of the following can be used: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a banana-shaped liquid crystal, and a mixed material such as a mixture of any of the above-described liquid crystal materials and a chiral material.

A color filter 166 is provided in order to adjust the color of light transmitted through a pixel to increase the color purity. For example, in a full-color display device using white light-emitting elements, a plurality of pixels provided with color filters of different colors are used. In that case, three colors, red (R), green (G), and blue (B), may be used, or four colors, red (R), green (G), blue (B), and yellow (Y), may be used. Further, a white (W) pixel may be added to R, G, and B pixels (and a Y pixel).

A black matrix 164 is provided between the adjacent color filters 166. The black matrix 164 blocks light emitted from an adjacent pixel, thereby preventing color mixture between the adjacent pixels. In one configuration, the black matrix 164 may be provided only between adjacent pixels of different emission colors and not between pixels of the same emission color. Here, the color filter 166 is provided so that its end portions overlap with the black matrix 164, whereby light leakage can be reduced.

The black matrix 164 can be formed using a material that blocks light transmitted through the pixel, for example, a metal material or a resin material including a pigment. Note that when the black matrix 164 is provided in a region other than the light-emitting portion 802, such as a driver circuit portion, undesired leakage of guided light or the like can be prevented.

As illustrated in FIG. 12B, by providing an overcoat 168 covering the color filter 166 and the black matrix 164, an impurity such as a pigment included in the color filter 166 or the black matrix 164 can be prevented from diffusing into the light-emitting element or the like. For the overcoat 168, a light-transmitting inorganic or organic insulating material can be used.

This embodiment can be implemented in appropriate combination with any of the other embodiments in this specification.

Embodiment 3

In this embodiment, electronic devices in which a light-emitting device of one embodiment of the present invention can be incorporated will be described.

Examples of the electronic devices to which the light-emitting device can be incorporated are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pachinko machines, and the like. Specific examples of these electronic devices are illustrated in FIGS. 13A to 13F.

Figure 13A:
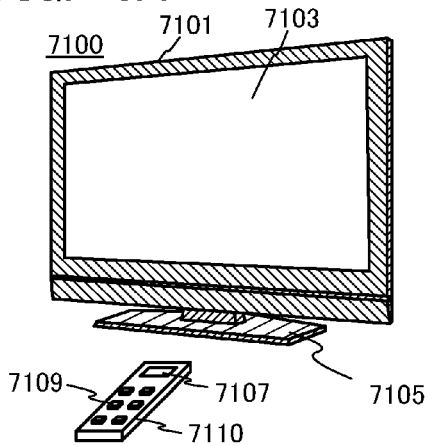
FIGS. 13A to 13F illustrate examples of electronic devices.

FIG. 13A illustrates an example of a television device. In a television device 7100, a display portion 7103 is incorporated in a housing 7101. The display portion 7103 is capable of displaying images, and the light-emitting device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the receiver, a general television broadcast can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

Figure 13B:
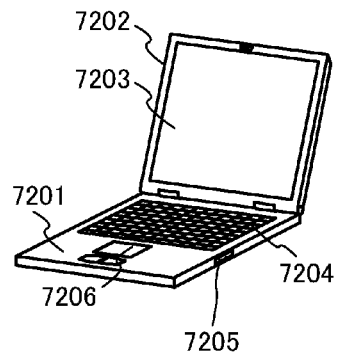

FIG. 13B illustrates a computer, which includes a main body 7201, a housing 7202, a display portion 7203, a keyboard 7204, an external connecting port 7205, a pointing device 7206, and the like. Note that this computer is manufactured using the light-emitting device for the display portion 7203.

Figure 13C:
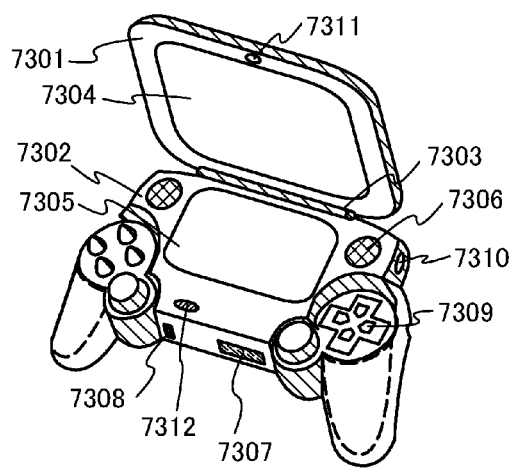

FIG. 13C illustrates a portable game machine, which includes two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. In addition, the portable game machine illustrated in FIG. 13C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 7312), and the like. Needless to say, the structure of the portable game machine is not limited to the above as long as a light-emitting device is used for at least either the display portion 7304 or the display portion 7305, or both, and may include other accessories as appropriate. The portable game machine illustrated in FIG. 13C has a function of reading out a program or data stored in a storage medium to display it on the display portion, and a function of sharing information with another portable game machine by wireless communication. The portable game machine in FIG. 13C can have a variety of functions without limitation to the above functions.

Figure 13D:
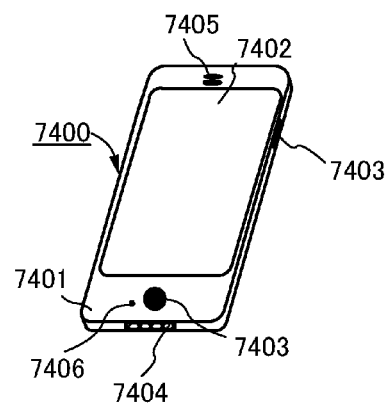

FIG. 13D illustrates an example of a cellular phone. The cellular phone 7400 is provided with a display portion 7402 incorporated in a housing 7401, operation buttons 7403, an external connection port 7404, a speaker 7405, a microphone 7406, and the like. Note that the cellular phone 7400 is manufactured using the light-emitting device for the display portion 7402.

When the display portion 7402 of the cellular phone 7400 illustrated in FIG. 13D is touched with a finger or the like, data can be input into the cellular phone 7400. Further, operations such as making a call and creating e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be input. In this case, it is preferable to display a keyboard or number buttons on almost the entire screen of the display portion 7402.

When a detection device including a sensor for detecting inclination, such as a gyroscope or an acceleration sensor, is provided inside the cellular phone 7400, display on the screen of the display portion 7402 can be automatically changed by determining the orientation of the cellular phone 7400 (whether the cellular phone is placed horizontally or vertically for a landscape mode or a portrait mode).

The screen modes are switched by touching the display portion 7402 or operating the operation buttons 7403 of the housing 7401. The screen modes can also be switched depending on the kind of image displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal is detected by an optical sensor in the display portion 7402, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Figure 13E:
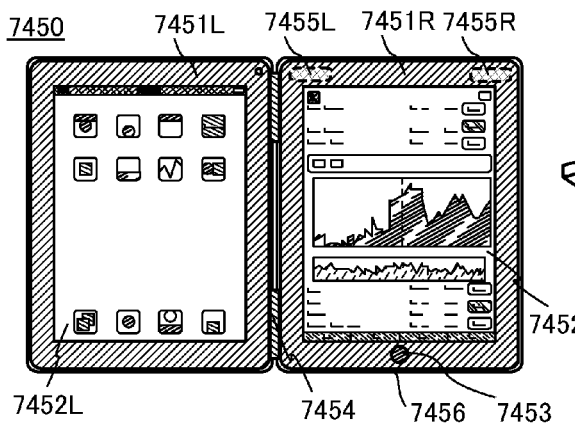

FIG. 13E illustrates an example of a folding computer. A folding computer 7450 includes a housing 7451L and a housing 7451R connected by hinges 7454. The folding computer 7450 further includes an operation button 7453, a left speaker 7455L, and a right speaker 7455R. In addition, a side surface of the folding computer 7450 is provided with an external connection port 7456, which is not illustrated. Note that when the folding computer is folded on the hinges 7454 so that a display portion 7452L provided in the housing 7451L and a display portion 7452R provided in the housing 7451R can face each other, the display portions can be protected by the housings.

Each of the display portions 7452L and 7452R is a component which can display images and to which information can be input by touch with a finger or the like. For example, the icon for the installed program is selected by touch with a finger, so that the program can be started. Further, changing the distance between fingers touching two positions of the displayed image enables zooming in or out on the image. Drag of a finger touching one position of the displayed image enables drag and drop of the image. Selection of the displayed character or symbol on the displayed image of a keyboard by touch with a finger enables information input.

Further, the computer 7450 can also include a gyroscope, an acceleration sensor, a global positioning system (GPS) receiver, a fingerprint sensor, or a video camera. For example, a detection device including a sensor which detects inclination, such as a gyroscope or an acceleration sensor, is provided to determine the orientation of the computer 7450 (whether the computer is placed horizontally or vertically for a landscape mode or a portrait mode) so that the orientation of the display screen can be automatically changed.

Furthermore, the computer 7450 can be connected to a network. The computer 7450 can not only display information on the Internet but also be used as a terminal which controls another electronic device connected to the network from a distant place.

Figure 13F:
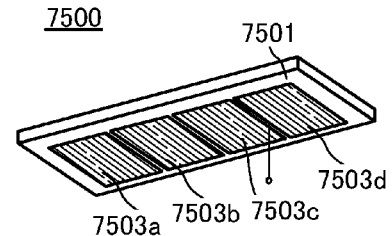

FIG. 13F illustrates an example of a lighting device. In a lighting device 7500, light-emitting devices 7503a, 7503b, 7503c, and 7503d of one embodiment of the present invention are incorporated in a housing 7501 as light sources. The lighting device 7500 can be attached to a ceiling, a wall, or the like.

This embodiment can be implemented in appropriate combination with any of the other embodiments in this specification.

This application is based on Japanese Patent Application serial no. 2013-076651 filed with Japan Patent Office on Apr. 2, 2013, the entire contents of which are hereby incorporated by reference.

What is claimed is:

1. A light-emitting device comprising:
    a first pixel and a second pixel each comprising a pixel circuit, the second pixel further comprising:
        a light-emitting element; and
        a first switch connecting the pixel circuit of the second pixel to the light-emitting element; and
    a second switch;
    wherein the pixel circuit of the first pixel is electrically connected to the light-emitting element of the second pixel through the second switch.

2. The light-emitting device according to claim 1, further comprising:
    a correction circuit; and
    a third switch in the second pixel,
    wherein the pixel circuit of the second pixel is electrically connected to the correction circuit through the third switch.

3. The light-emitting device according to claim 1,
    wherein the first pixel and the second pixel are adjacent pixels of a column of pixels.

4. The light-emitting device according to claim 1,
wherein the first pixel and the second pixel are adjacent pixels of a row of pixels.

5. The light-emitting device according to claim 1,
wherein the second switch is comprised in the first pixel.

6. The light-emitting device according to claim 2, configured to:
perform light emission using the light-emitting element of the second pixel controlled by the pixel circuit of the first pixel while the third switch is conducting.

7. An electronic device incorporating the light-emitting device of claim 1.

8. A light-emitting device comprising:
a column of N rows of pixels, N being a natural number greater than or equal to 3;
a pixel circuit in each pixel;
a light-emitting element and a first switch connecting the pixel circuit to the light-emitting element in each pixel of the second row to the N-th row; and
(N−1) second switches,
wherein a pixel circuit comprised in a pixel of a k-th row is electrically connected to a light-emitting element included in a pixel of a (k+1)-th row through a corresponding one of the second switches, for each natural number k greater than or equal to 1 and less than N.

9. The light-emitting device according to claim 8, further comprising:
a correction circuit; and
a third switch in each of the pixels of the first row to the N-th row of the N rows of pixels,
wherein the correction circuit is electrically connected to the pixel circuit of each of the pixels of the first row to the N-th row through a corresponding one of the third switches.

10. The light-emitting device according to claim 8, further comprising:
a correction circuit;
a first to a third transistors, a capacitor, a first wiring and a second wiring in each pixel circuit;
a light-emitting element, a third wiring, and a fourth wiring in each pixel of the second row to the N-th row of the N rows of pixels;
a fifth wiring and a sixth wiring; and
(N−1) seventh wirings;
wherein each first switch is a fourth transistor,
wherein each second switch is a fifth transistor,
wherein, for each of the pixel circuits:
one of a source electrode and a drain electrode of the first transistor is electrically connected to the fifth wiring,
the other of the source electrode and the drain electrode of the first transistor is electrically connected to a gate electrode of the second transistor and to one electrode of the capacitor,
one of a source electrode and a drain electrode of the second transistor is electrically connected to the first wiring,
the other of the source electrode and the drain electrode of the second transistor is electrically connected to one of a source electrode and a drain electrode of the third transistor, and to another electrode of the capacitor,
the other of the source electrode and the drain electrode of the third transistor is electrically connected to the sixth wiring,
a gate electrode of the first transistor and a gate electrode of the third transistor are electrically connected to the second wiring,
wherein, for the pixels of the second row to the N-th row:
the other of the source electrode and the drain electrode of the second transistor is electrically connected to one of a source electrode and a drain electrode of the fourth transistor,
the other of the source electrode and the drain electrode of the fourth transistor is electrically connected to one of electrodes of the light-emitting element;
another one of the electrodes of the light-emitting element is electrically connected to the third wiring, and
a gate electrode of the fourth transistor is electrically connected to the fourth wiring,
wherein gate electrodes of the fifth transistors are each electrically connected to a corresponding one of the seventh wirings,
wherein each of the fifth transistors is configured to electrically connect the other of the source electrode and the drain electrode of the second transistor in a pixel of a corresponding k-th row to the one electrode of the light-emitting element included in a pixel of a (k+1)-th row, for each natural number k greater than or equal to 1 and less than N, and
wherein the sixth wiring is electrically connected to the correction circuit.

11. The light-emitting device according to claim 10,
wherein the first wirings are electrically connected to a high potential supply circuit,
wherein the second wirings are electrically connected to a first gate line driver circuit,
wherein the third wirings are electrically connected to a lower potential supply circuit or a ground wiring,
wherein the fourth wirings are electrically connected to a second gate line driver circuit,
wherein the fifth wiring is electrically connected to a signal driver circuit, and
wherein the seventh wirings are electrically connected to a third gate line driver circuit.

12. The light-emitting device according to claim 8,
wherein the pixel of the first row does not comprise a light-emitting element.

13. The light-emitting device according to claim 8,
wherein the pixel of the N-th row does not comprise a second switch.

14. The light-emitting device according to claim 8,
wherein the (N−1) second switches are comprised in the first to the (N−1) rows of pixels.

15. The light-emitting device according to claim 10,
wherein the second switch configured to electrically connect a pixel circuit comprised in a pixel of an m-th row to a light-emitting element included in a pixel of an (m+1)-th row is formed in the pixel of the m-th row, for each natural number m greater than or equal to 1 and less than N.

16. The light-emitting device according to claim 9, configured to:
perform light emission using the light-emitting element of the pixel of the (k+1)-th row controlled by the pixel circuit of the pixel of the k-th row while the third switch connecting the pixel circuit of the pixel of the (k+1)-th row to the correction circuit is conducting.

17. An electronic device incorporating the light-emitting device of claim 8.

18. A light-emitting device comprising:
a correction circuit;
a first and a second pixels each comprising a first to a third transistors, a capacitor, a first wiring and a second wiring, the second pixel further comprising a fourth transistor, a light-emitting element, a third wiring, and a fourth wiring;

a fifth to a seventh wirings; and a fifth transistor, wherein, for each of the first pixel and the second pixel:
one of a source electrode and a drain electrode of the first transistor is electrically connected to the fifth wiring,
the other of the source electrode and the drain electrode of the first transistor is electrically connected to a gate electrode of the second transistor and to one electrode of the capacitor,
one of a source electrode and a drain electrode of the second transistor is electrically connected to the first wiring,
the other of the source electrode and the drain electrode of the second transistor is electrically connected to one of a source electrode and a drain electrode of the third transistor, and to another electrode of the capacitor,
the other of the source electrode and the drain electrode of the third transistor is electrically connected to the sixth wiring,
a gate electrode of the first transistor and a gate electrode of the third transistor are electrically connected to the second wiring, wherein, for the second pixel:
the other of the source electrode and the drain electrode of the second transistor is electrically connected to one of a source electrode and a drain electrode of the fourth transistor,
the other of the source electrode and the drain electrode of the fourth transistor is electrically connected to an electrode of the light-emitting element;
another electrode of the light-emitting element is electrically connected to the third wiring, and
a gate electrode of the fourth transistor is electrically connected to the fourth wiring, wherein a gate electrode of the fifth transistor is electrically connected to the seventh wiring, wherein one of a source electrode and a drain electrode of the fifth transistor is electrically connected to the other of the source electrode and the drain electrode of the second transistor of the first pixel, wherein the other of the source electrode and the drain electrode of the fifth transistor is electrically connected to the electrode of the light-emitting element of the second pixel, and wherein the sixth wiring is electrically connected to the correction circuit.

19. The light-emitting device according to claim 18,
wherein the first wirings are electrically connected to a high potential supply circuit,
wherein the second wirings are electrically connected to a first gate line driver circuit,
wherein the third wiring is electrically connected to a lower potential supply circuit or a ground wiring,
wherein the fourth wiring is electrically connected to a second gate line driver circuit,
wherein the fifth wiring is electrically connected to a signal driver circuit, and
wherein the seventh wiring is electrically connected to a third gate line driver circuit.

20. The light-emitting device according to claim 18, further comprising:
a fourth transistor, a light-emitting element, a third wiring, and a fourth wiring in the first pixel, the first pixel and the second pixel having a same structure.

21. The light-emitting device according to claim 18, configured to:
perform light emission using the light-emitting element of the second pixel controlled by the pixel circuit of the first pixel while the third transistor of the second pixel is switched on.

* * * * *